US011828452B2

(12) United States Patent
Kikuchi

(10) Patent No.: US 11,828,452 B2
(45) Date of Patent: Nov. 28, 2023

(54) LIGHT CONVERGING MEMBER AND OPTICAL COMPONENT

(71) Applicant: NGK Insulators, Ltd., Nagoya (JP)

(72) Inventor: Yoshio Kikuchi, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/805,502

(22) Filed: Jun. 6, 2022

(65) Prior Publication Data

US 2022/0299188 A1    Sep. 22, 2022

Related U.S. Application Data

(63) Continuation of application No. PCT/JP2020/044428, filed on Nov. 30, 2020.

(30) Foreign Application Priority Data

Dec. 10, 2019    (JP) .................................. 2019-222658

(51) Int. Cl.
    *F21V 5/04*    (2006.01)
(52) U.S. Cl.
    CPC ...................................... *F21V 5/04* (2013.01)
(58) Field of Classification Search
    CPC ... F21V 5/04; F21V 5/00; F21V 5/046; F21V 5/048; G02B 2003/0093; G02B 3/00; G02B 3/0037; G02B 3/0043
    See application file for complete search history.

(56) References Cited

U.S. PATENT DOCUMENTS

| 2016/0187250 | A1 | 6/2016 | Nagai |
| 2017/0261176 | A1* | 9/2017 | Fukuda ..................... F21V 3/02 |
| 2018/0176486 | A1* | 6/2018 | Kadowaki ............... F21V 14/02 |
| 2019/0338915 | A1* | 11/2019 | Shum ...................... F21V 5/048 |
| 2020/0124248 | A1* | 4/2020 | Kim .................... G02B 19/0028 |

FOREIGN PATENT DOCUMENTS

| JP | 2016-121926 A | 7/2016 |
| JP | 2017-162662 A | 9/2017 |

OTHER PUBLICATIONS

English translation of the International Preliminary Report on Patentability (Chapter I) dated Jun. 23, 2022 (Application No. PCT/JP2020/044428).
International Search Report and Written Opinion (Application No. PCT/JP2020/044428) dated Jan. 19, 2021 (with English translation).

* cited by examiner

*Primary Examiner* — Bao Q Truong
(74) *Attorney, Agent, or Firm* — BURR PATENT LAW, PLLC

(57) ABSTRACT

A light converging member (10) according to an embodiment of the present invention includes: a recess portion (32) that is used for an optical component (100) with an optical element (14) for emitting light, the recess portion being opposed to the optical element (14) and having a size 0.5 or more times larger than the maximum length of a light emission region in the optical element; and a lens body (30) for converging light having passed through the recess portion (32).

9 Claims, 9 Drawing Sheets

FIG. 5

[TABLE 1]

| | | LIGHT EXTRACTION EFFICIENCYE (%) | | | | LIGHT DISTRIBUTION ANGLE θf(°) | ILLUMINANCE I (a.u.) | |
|---|---|---|---|---|---|---|---|---|
| | | CONCAVE PORTION | | | | OPTICAL CHARACTERISTICS | | |
| | SHAPE | DIAMETER Lr (mm) | Lr/Dt | DEPTH hr (mm) | hr/Lr | | | 1/θf |
| EXAMPLE 1 | HEMISPHERICAL DOME | 0.6 | 0.53 | 0.3 | 0.50 | 87 | 10.8 | - | - |
| EXAMPLE 2 | HEMISPHERICAL DOME | 0.7 | 0.62 | 0.35 | 0.50 | - | 10.6 | - | - |
| EXAMPLE 3 | HEMISPHERICAL DOME | 0.8 | 0.71 | 0.4 | 0.50 | - | 10.7 | - | - |
| EXAMPLE 4 | HEMISPHERICAL DOME | 0.9 | 0.80 | 0.45 | 0.50 | - | 11.0 | - | - |
| EXAMPLE 5 | HEMISPHERICAL DOME | 1.0 | 0.88 | 0.5 | 0.50 | - | 11.8 | - | - |
| EXAMPLE 6 | HEMISPHERICAL DOME | 1.1 | 0.97 | 0.55 | 0.50 | 90 | 12.2 | 3.1 | 0.25 |
| EXAMPLE 7 | HEMISPHERICAL DOME | 1.2 | 1.06 | 0.6 | 0.50 | - | 12.5 | - | - |
| EXAMPLE 8 | HEMISPHERICAL DOME | 1.6 | 1.41 | 0.8 | 0.50 | - | 13.5 | - | - |
| EXAMPLE 9 | HEMISPHERICAL DOME | 2.0 | 1.77 | 1 | 0.50 | - | 14.2 | - | - |
| EXAMPLE 10 | HEMISPHERICAL DOME | 2.4 | 2.12 | 1.2 | 0.50 | - | 14.6 | - | - |
| EXAMPLE 11 | HEMISPHERICAL DOME | 2.6 | 2.30 | 1.3 | 0.50 | - | 14.8 | - | - |
| EXAMPLE 12 | LOW DOME | 1.1 | 0.97 | 0.275 | 0.25 | - | 16.2 | 3.3 | 0.21 |
| EXAMPLE 13 | LOW DOME | 1.1 | 0.97 | 0.4 | 0.36 | - | 14.5 | 3.3 | 0.22 |
| EXAMPLE 14 | TALL DOME | 1.1 | 0.97 | 0.7 | 0.64 | - | 10.4 | 2.5 | 0.24 |
| EXAMPLE 15 | TALL DOME | 1.1 | 0.97 | 0.825 | 0.75 | - | 11.4 | 1.8 | 0.16 |
| EXAMPLE 16 | TALL DOME | 1.1 | 0.97 | 0.9 | 0.82 | - | 13.1 | 1.4 | 0.11 |
| EXAMPLE 17 | TALL DOME | 1.1 | 0.97 | 0.95 | 0.86 | - | 16.4 | 1.1 | 0.07 |
| EXAMPLE 18 | COLUMN | 1.1 | 0.97 | 0.5 | 0.45 | 89 | 15.4 | - | - |
| COMPARATIVE EXAMPLE 1 | NO CONCAVE PORTION | - | - | - | - | 86 | 17.6 | 3.3 | 0.19 |
| COMPARATIVE EXAMPLE 2 | HEMISPHERICAL DOME | 0.3 | 0.27 | 0.15 | 0.50 | - | 19.0 | - | - |
| COMPARATIVE EXAMPLE 3 | HEMISPHERICAL DOME | 0.4 | 0.35 | 0.2 | 0.50 | - | 19.7 | - | - |
| COMPARATIVE EXAMPLE 4 | HEMISPHERICAL DOME | 0.5 | 0.44 | 0.25 | 0.50 | - | 19.5 | - | - |
| COMPARATIVE EXAMPLE 5 | TALL DOME | 1.1 | 0.97 | 1 | 0.91 | - | 21.4 | 0.8 | 0.04 |

FIG. 6

[TABLE 2]

| | | |
|---|---|---|
| LIGHT CONVERGING MEMBER | HEIGHT hc [mm] | 2.47 |
| | MATERIAL | QUARTZ GLASS |
| LENS BODY | SHAPE | TALL LENS |
| | MAXIMUM DIAMETER Lm [mm] | 3.2 |
| | MAXIMUM HEIGHT hm [mm] | 1.97 |
| | hm/Lm | 0.62 |
| BASE | HEIGHT hl [mm] | 0.5 |
| | OUTER DIAMETER Da [mm] | 3.5 |
| CONCAVE PORTION | OUTER PERIPHERY Ra [mm] | 0.1 |
| | DISTANCE dr [mm] | 0.5 |
| | DISTANCE dt [mm] | 0.4 |
| ACCOMMODATION SPACE | POSITION | SUBSTRATE SIDE |
| | SHAPE | COLUMN |
| | OUTER DIAMETER Dk [mm] | 2.5 |
| | HEIGHT hk [mm] | 0.5 |
| OPTICAL ELEMENT | SHAPE | QUADRANGLE |
| | SIZE Dt [mm] | 1.1 |
| | HEIGHT ht [mm] | 0.1 |

LIGHT CONVERGING MEMBER AND OPTICAL COMPONENT

CROSS-REFERENCE TO RELATED APPLICATIONS

This application is a Continuation of International Application No. PCT/JP2020/044428 filed on Nov. 30, 2020, which is based upon and claims the benefit of priority from Japanese Patent Application No. 2019-222658 filed on Dec. 10, 2019, the contents all of which are incorporated herein by reference.

TECHNICAL FIELD

The present invention relates to a light converging member that converges light from an optical element, and to an optical component.

BACKGROUND ART

Ultraviolet light sources are used in various fields such as purification, sterilization, and optical analysis. As the ultraviolet light source, an optical element (for example, LED: light emitting diode, LD: semiconductor laser) which can be easily miniaturized has been developed (see JP 2016-121926 A).

Here, for example, for optical analysis (as an example, concentration analysis of deoxyribonucleic acid (DNA)), it is preferable that a change in intensity of light due to a change in distance from a light source to an illuminance sensor is small, in other words, the light distribution angle is narrow.

However, in order to obtain a narrow light distribution angle in a surface emitting light source such as an LED, a large lens is generally used, and it is not easy to achieve both reduction in the light distribution angle (narrowing of the angle) and miniaturization of the light source.

SUMMARY OF THE INVENTION

An object of the present invention is to provide a light converging member and an optical component that achieve both reduction in light distribution angle and miniaturization of a light source.

A light converging member according to an embodiment is used in an optical component including an optical element configured to emit light, and comprises: a concave portion facing the optical element and having a size of 0.5 times or more a maximum length of a light emitting region in the optical element; and a lens body configured to converge light that has passed through the concave portion.

According to the present invention, it is possible to provide a light converging member and an optical component that achieve both reduction in light distribution angle and miniaturization of a light source.

BRIEF DESCRIPTION OF DRAWINGS

FIG. 5 is Table 1 showing the state of concave portions and optical characteristics in Examples and Comparative Examples;

FIG. 6 is Table 2 showing common conditions in Examples and Comparative Examples;

DESCRIPTION OF THE INVENTION

Hereinafter, a light converging member and an optical component according to an embodiment will be described with reference to FIGS. 1 to 9.

Figure 1:
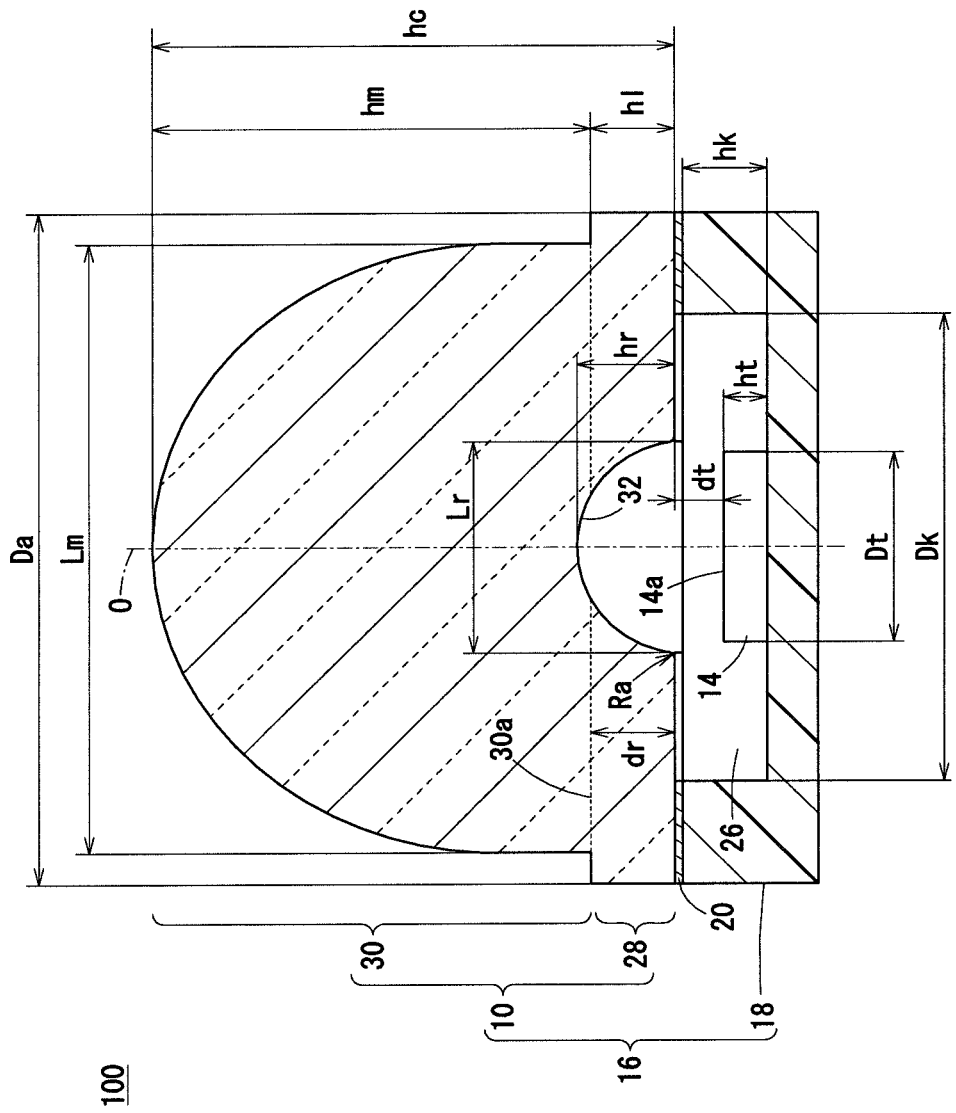
FIG. 1 is a longitudinal sectional view schematically showing an optical component including a light converging member according to an embodiment.

As shown in FIG. 1, an optical component 100 includes at least one optical element 14, and a package 16. The optical element 14 emits light (for example, ultraviolet light). The package 16 accommodates the optical element 14.

The optical element 14 is, for example, a light emitting diode (LED) or a semiconductor laser (LD). Although not shown, the optical element 14 can be produced by, for example, stacking a GaN-based crystal layer having a quantum well structure on a sapphire substrate.

For example, a so-called face-up mounting method can be adopted for the optical element 14. In the face-up mounting method, a crystal layer forming surface 14*a* of the optical element 14 faces a light converging member 10 described later, and functions as a light emitting surface. More specifically, terminals (not shown) that are led out from the optical element 14, and circuit wirings (not shown) that are formed on a mounting substrate 18 are electrically connected by, for example, bonding wires (not shown). Note that a so-called flip-chip mounting method may also be adopted in which the crystal layer forming surface 14*a* is disposed on the bottom surface of an accommodation space 26, and the back surface of the sapphire substrate functions as a light emitting surface.

The package 16 includes the mounting substrate 18 and the light converging member 10.

The mounting substrate 18 is made of, for example, aluminum nitride, alumina, or aluminum, and has the accommodation space 26 in which the optical element 14 is accommodated. The accommodation space 26 has, for example, a columnar shape or a rectangular parallelepiped shape, and the optical element 14 is disposed on the bottom surface thereof.

Figure 2:
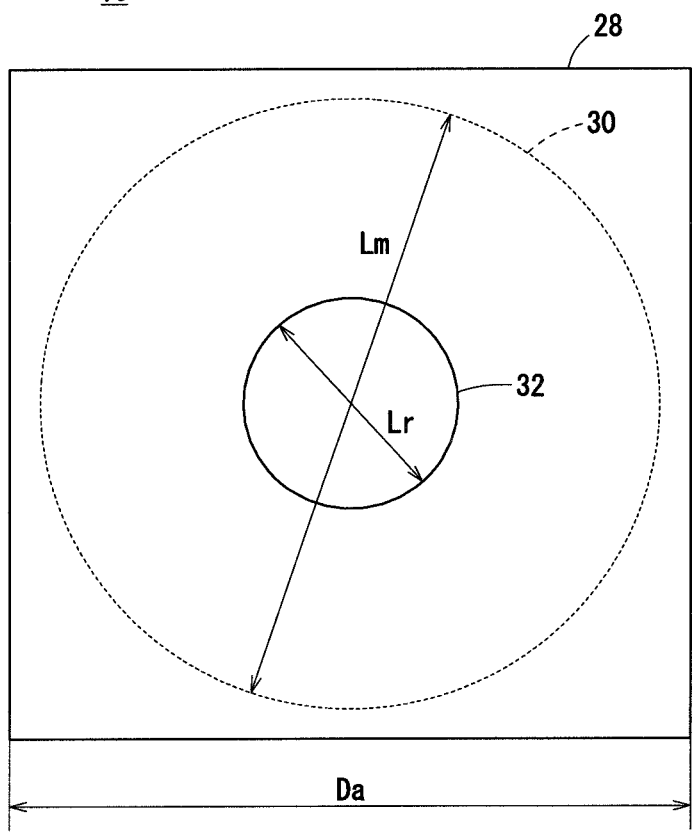
FIG. 2 is a bottom view schematically showing a state in which the light converging member according to the embodiment is viewed from below.

The light converging member 10 is fixed onto the mounting substrate 18, and as shown in FIGS. 1 and 2, includes a base 28, a lens body 30, and a concave portion 32. The base 28 and the lens body 30 can be integrally formed of a material (for example, quartz glass, borosilicate glass, silicone resin, or fluororesin having a refractive index n of 1.44 to 1.54) that transmits light (for example, ultraviolet light). As described later, quartz glass can be molded by, for example, a powder sintering method. In addition, borosilicate glass, silicone resin, and fluororesin can be molded by, for example, press molding, injection molding, or machining.

The light converging member 10 is bonded onto the mounting substrate 18 via, for example, an organic or metallic adhesive layer 20. As the organic adhesive layer 20, for example, an epoxy-based, silicone-based, or urethane-based adhesive can be used. As the metallic adhesive layer 20, for example, AuSn-based solder can be used.

The base 28 has an annular shape and is fixed onto the mounting substrate 18. The outer shape (planar shape) of the base 28 is, for example, a square shape. However, the outer shape of the base 28 may be a circular shape, or a polygonal shape such as a rectangular shape, a triangular shape, or a hexagonal shape. The light converging member 10 may not include the base 28, and may be formed of the lens body 30 and the concave portion 32.

The lens body 30 converges light, is formed on the base 28 integrally therewith, and has an upwardly convex shape. The lens body 30 may have an outer periphery whose distance from the center continuously decreases as it goes farther away from the optical element 14. Further, the lens body 30 may have a curved surface shape symmetrical with respect to a central axis O. Note that the entire outer surface of the lens body 30 need not be a curved surface. For example, the vicinity of the top portion of the lens body 30 (a part of the upper surface thereof intersecting with the central axis O) may have a planar shape. This is because light that travels along the central axis O is less required to be converged.

The lens body 30 preferably has a ratio of a maximum height hm to a maximum diameter Lm (aspect ratio Rm=hm/Lm) of greater than 0.5 (preferably has a tall lens shape). By making the aspect ratio Rm greater than 0.5, a light distribution angle θf can be easily reduced.

The lens body 30 has a virtual bottom surface 30a at the boundary with the base 28. The planar shape of the bottom surface 30a is, for example, a circular shape. However, the planar shape of the bottom surface 30a may be an elliptical shape, a track shape, or the like.

The concave portion 32 is disposed to face the optical element 14, and as will be described later, supports the light converging function of the lens body 30, and contributes to improvement of an illuminance I and reduction in the light distribution angle θf. Here, the concave portion 32 is formed in the base 28, but may be formed on the lens body 30 as will be described later.

The concave portion 32 may have various shapes such as a dome shape, a columnar shape, a prismatic shape (for example, a triangular prismatic shape, a quadrangular prismatic shape, or a pentagonal or higher polygonal prismatic shape), a conical shape, and a pyramidal shape (for example, a triangular pyramidal shape, a quadrangular pyramidal shape, or a pentagonal or higher polygonal pyramidal shape). In the case of a conical shape or a pyramidal shape, it is preferable that the apex thereof is disposed on the top.

The bottom surface of the concave portion 32 may have, for example, a flat surface close to the central axis O and an inclined surface distant from the central axis O. Here, if the inclination of the bottom surface is continuously changed according to the distance from the central axis O, (the bottom surface of) the concave portion 32 has a dome shape. Examples of the dome shape may include a hemispherical dome shape, a low dome shape, and a tall dome shape. The hemispherical dome shape is formed of a curved surface for which the ratio of a depth hr to a diameter Lr of the outer periphery (aspect ratio Rr=hr/Lr) is 0.5. The low dome shape is formed of a curved surface having an aspect ratio Rr of less than 0.5, and the tall dome shape is formed of a curved surface having an aspect ratio Rr of greater than 0.5.

The diameter Lr means the maximum length of the bottom surface of the concave portion 32. That is, if the shape of the bottom surface is a circle, the diameter Lr means the diameter of the circle. If the shape of the bottom surface is a triangular shape, the diameter Lr means the length of a side of the triangular shape. If the shape of the bottom surface is a polygonal shape having four or more sides, the diameter Lr means the length of a diagonal line of the polygonal shape (the maximum length of a line connecting the vertices of the polygonal shape).

As described above, the concave portion 32 having various shapes can support the light converging function of the lens body 30 and can contribute to improvement of the illuminance I and reduction in the light distribution angle θf.

The light converging member 10 having such a shape can be manufactured by a powder sintering method, press molding, injection molding, or machining. In the case of the powder sintering method, for example, a molding slurry containing a quartz glass powder (silica powder) and an organic compound is cast into a mold. The slurry is solidified by a chemical reaction between the organic compounds, for example, a chemical reaction between a dispersion medium and a curing agent, or between the curing agents. The solidified slurry becomes a molded body. The molded body is released from the mold and fired. In this manner, the light converging member 10 can be manufactured.

Regarding the dimensions of the light converging member 10, a height hc of the light converging member 10 is, for example, 0.7 to 30 [mm]. The base 28 has, for example, an outer diameter Da of 3.0 to 100 [mm] and a height hl of 0.2 to 1 [mm]. The lens body 30 has, for example, a maximum diameter Lm of 1 to 20 [mm], a maximum height hm of 0.5 to 30.0 [mm], and an aspect ratio Rm of 0.3 to 1.5.

The concave portion 32 has, for example, a diameter Lr of 0.1 to 5.0 [mm], a depth hr of 0.1 to 5.0 [mm], and an aspect ratio Rr of 0.1 to 1.0.

A distance dr between the bottom surface 30a of the lens body 30 and the outer periphery of the concave portion 32 (here, the bottom surface of the base 28) is, for example, 0 to 1.0 [mm].

The optical element 14 has a substantially rectangular parallelepiped shape (for example, a rectangular parallelepiped shape, and a chamfered rectangular parallelepiped shape), a substantially prismatic shape (for example, a prismatic shape (a triangular prism, a hexagonal prism, or the like), and a chamfered prismatic shape). The shape of the optical element 14 in top view is, for example, a quadrangle with four right angles (square or rectangle), a chamfered rectangle, a triangle, or a hexagon.

The optical element 14 has, for example, a height (thickness) ht of 0.005 to 0.5 [mm] and a size Dt of 0.5 to 2.0 [mm].

The size Dt means the maximum length of a light emitting region of the optical element 14 in top view. When the entire optical element 14 emits light and the shape of the optical element 14 in top view is a polygonal shape having four or more sides (for example, a quadrangular shape or a hexagonal shape), the size Dt means the length of a diagonal line of the polygonal shape (the maximum length of a line connecting the vertices of the polygonal shape). In addition, when a part of the optical element 14 emits light, the maximum length of the light emitting region in top view is the size Dt.

A distance dt between the upper surface of the optical element 14 (the light emitting surface, the crystal layer forming surface 14a) and the outer periphery of the concave portion 32 (here, the bottom surface of the base 28) is, for example, 0.05 to 1.0 [mm].

Modification

Figure 3:
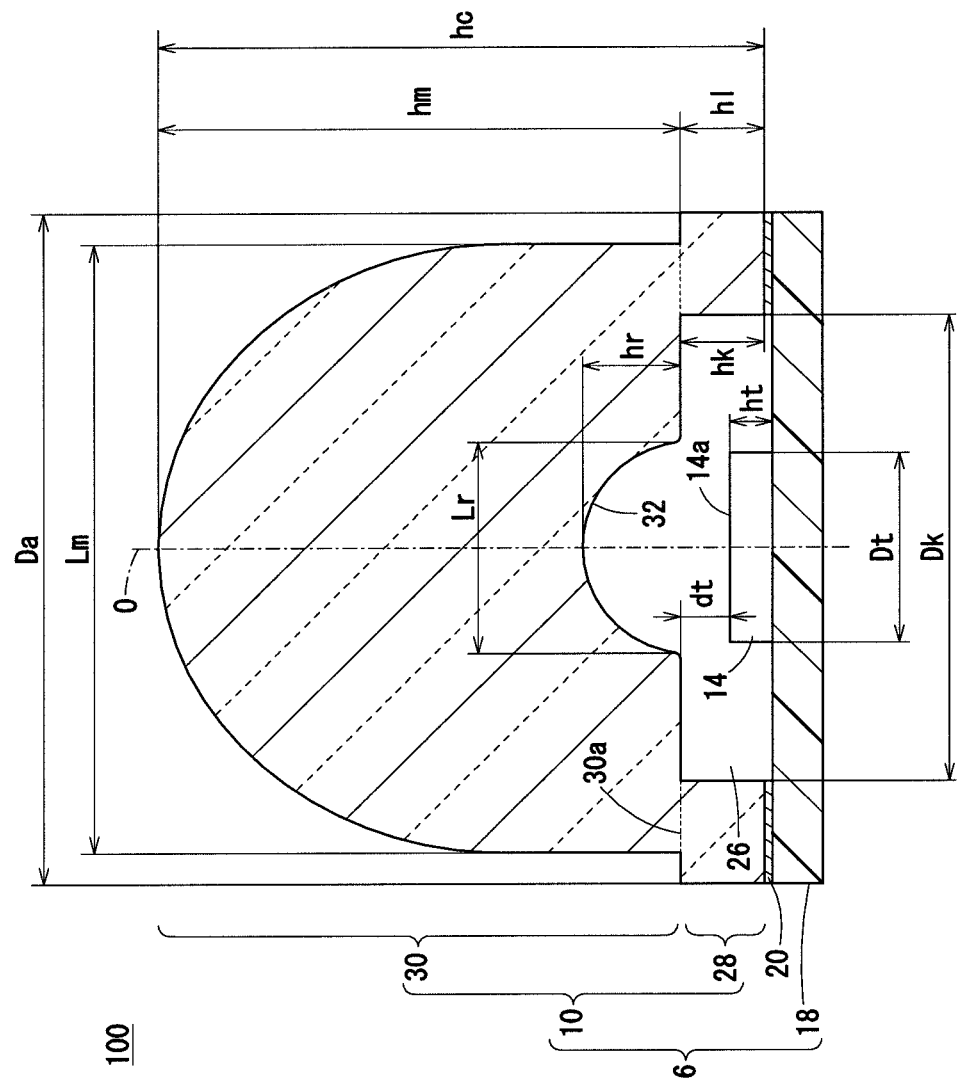
FIG. 3 is a longitudinal sectional view schematically showing an optical component including a light converging member according to a modification.
Figure 4:
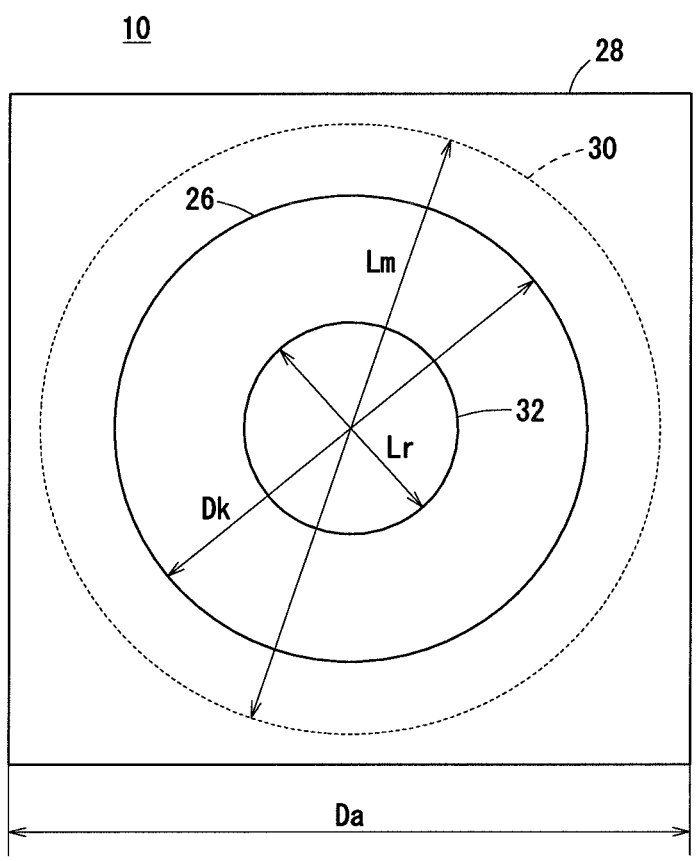
FIG. 4 is a bottom view schematically showing a state in which the light converging member according to the modification is viewed from below.

As shown in FIGS. 3 and 4, in the optical component 100 according to a modification, the mounting substrate 18 does not have the accommodation space 26. The light converging member 10 has the accommodation space 26, and the concave portion 32 is disposed on the upper surface of the accommodation space 26. Therefore, the height of the outer periphery of the concave portion 32 coincides with the height of the bottom surface 30a of the lens body 30 (distance dr=0).

As described above, also in the modification in which the mounting substrate 18 does not have the accommodation space 26, the concave portion 32 can support the light converging function of the lens body 30 and can contribute to improvement of the illuminance I and reduction in the light distribution angle θf, as in the embodiment.

Example

The light distribution angle θf was confirmed for Examples 1 to 18 and Comparative Examples 1 to 5. In some examples, a light extraction efficiency E and the illuminance I were also confirmed.

The examples and the comparative examples can be basically represented by FIG. 1. In these examples and comparative examples, the shape, the diameter Lr, and the depth hr of the concave portion 32 were changed as follows (see Table 1).

The shape of the concave portion 32 was a hemispherical dome shape in Examples 1 to 11 and Comparative Examples 2 to 4, a low dome shape in Examples 12 and 13, a tall dome shape in Examples 14 to 17 and Comparative Example 5, and a columnar shape in Example 18. In Comparative Example 1, the concave portion 32 was not provided.

The aspect ratio Rr (hr/Lr) is 0.5 for the hemispherical dome shape, is less than 0.5 for the low dome shape, and is greater than 0.5 for the tall dome shape.

The diameters Lr in Comparative Examples 2 to 4 and Examples 1 to 11 were 0.3, 0.4, 0.5, 0.6, 0.7, 0.8, 0.9, 1.0, 1.1, 1.2, 1.6, 2.0, 2.4, and 2.6 [mm], respectively. (Here, the ratios (Lr/Dt) of the diameter Lr to the size Dt of the optical element 14 were 0.27, 0.35, 0.44, 0.53, 0.62, 0.71, 0.80, 0.88, 0.97, 1.06, 1.41, 1.77, 2.12, and 2.30, respectively).

In Examples 12 to 18 and Comparative Example 5, the diameter Lr was 1.1 [mm]. (Here, the ratio (Lr/Dt) was 0.97). The depths hr in Examples 12 to 17 and Comparative Example 5 were 0.275, 0.4, 0.7, 0.825, 0.9, 0.95, and 1 [mm], respectively. (The aspect ratios Rr were 0.25, 0.36, 0.64, 0.75, 0.82, 0.86, and 0.91, respectively).

The light converging member 10 of each of the examples and each of the comparative examples had a shape shown in Table 2 except for the concave portion 32 (the shape, the diameter Lr, and the depth hr thereof), and was made of quartz glass. In other words, the light converging member 10 had a height hc of 2.47 [mm]. The lens body 30 had a tall lens shape, a maximum diameter Lm of 3.2 [mm], a maximum height hm of 1.97 [mm], and an aspect ratio Rm (hm/Lm) of 0.62.

The concave portion 32 had an outer periphery radius of curvature Ra of 0.1 [mm], a distance dr of 0.5 [mm], and a distance dt of 0.4 [mm].

The base 28 had a height hl of 0.5 [mm] and an outer diameter Da of 3.5 [mm]. The accommodation space 26 was disposed on the mounting substrate 18, and had a columnar shape, an outer diameter Dk of 2.5 [mm], and a height hk of 0.5 [mm].

The optical element 14 is an LED chip and had a rectangular parallelepiped shape (quadrangular shape in top view), a size Dt of 1.1 [mm] (the length of one side of the quadrangle: 0.8 [mm]), and a height ht of 0.1 [mm].

The distribution of light distribution, the light distribution angle θf, the light extraction efficiency E, and the illuminance I at the lens bonding portion of the optical components according to the examples and the comparative examples were confirmed by simulation (ray tracing method).

[Simulation Results]

Table 1 shows the light distribution angle θf, the light extraction efficiency E, and the illuminance I of the optical components according to the examples and the comparative examples.

Figure 7:
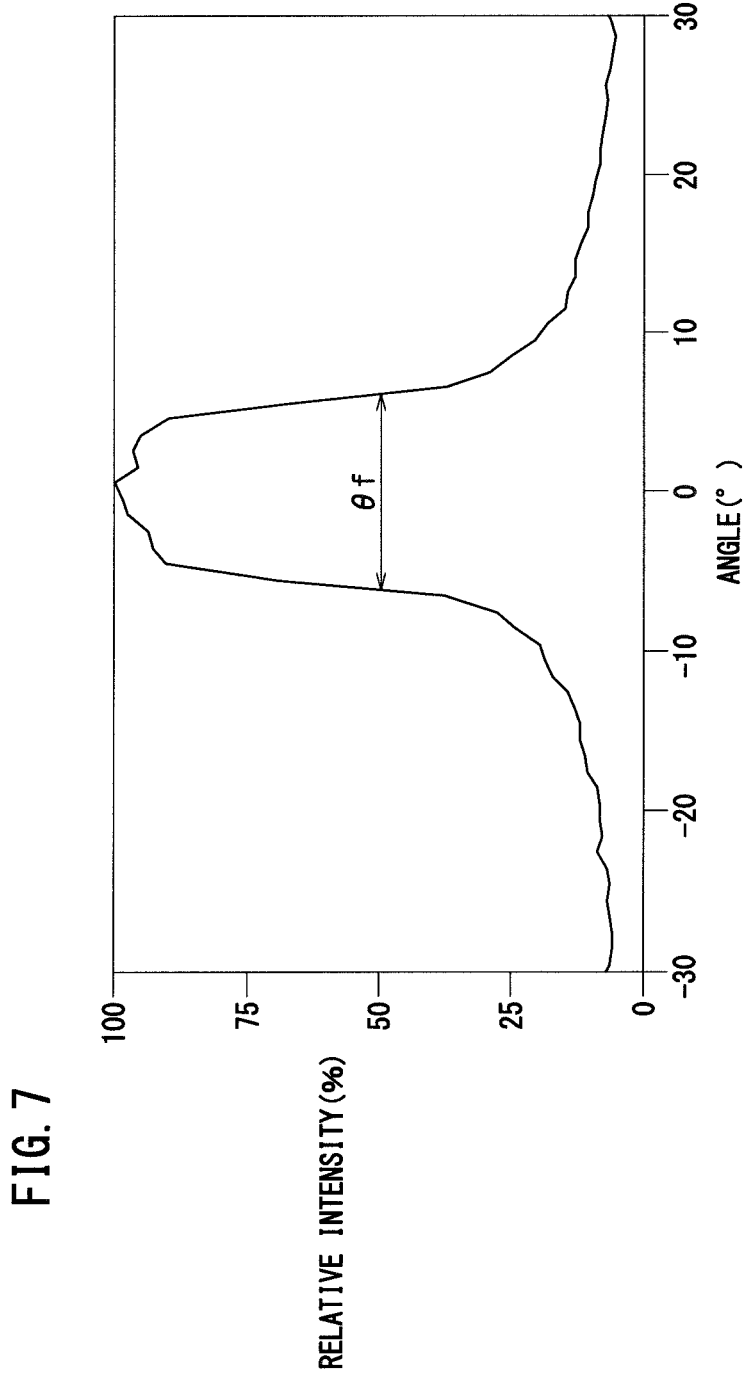
FIG. 7 is a graph showing a light distribution angle.

The light distribution angle θf refers to an angular width in which the luminous intensity is ½ of the maximum luminous intensity in the angular distribution of the luminous intensity (see FIG. 7). The light extraction efficiency E refers to the ratio of the light output emitted to the exterior of the optical component to the light output emitted from the LED chip. The illuminance I indicates a relative value of the illuminance in a direction parallel to the central axis O (angle θ=0).

Figure 8:
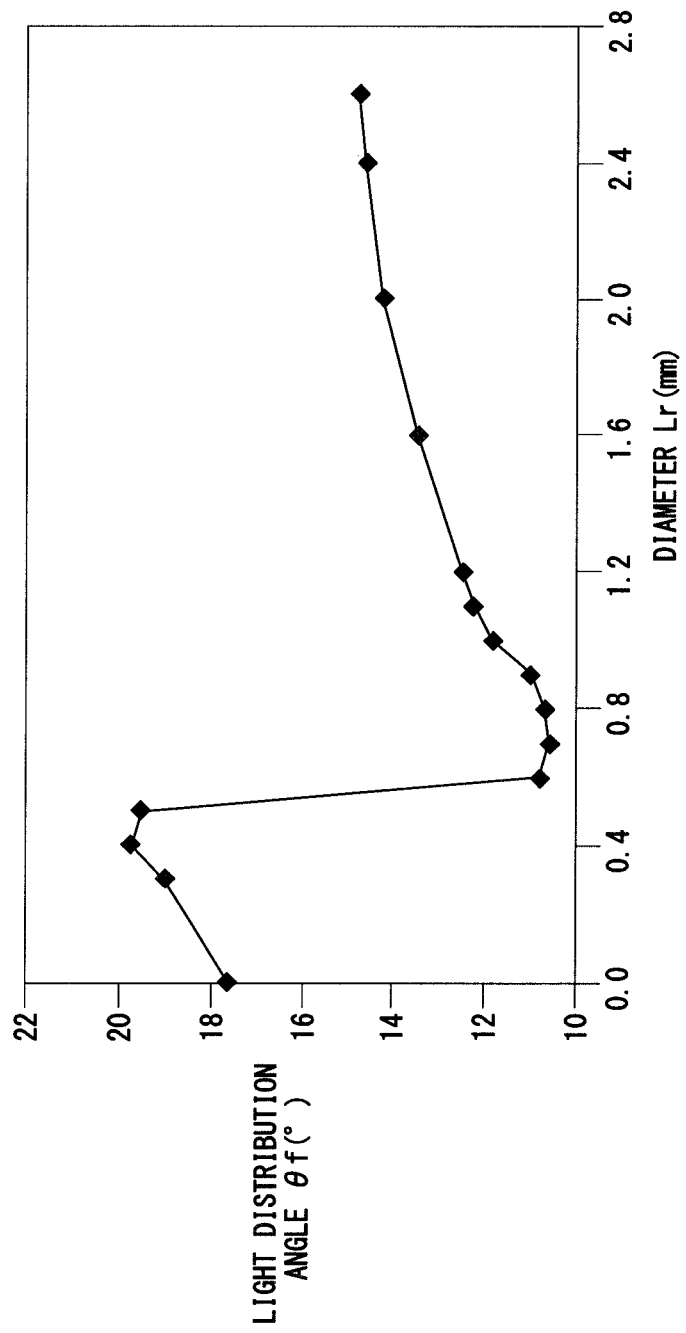
FIG. 8 is a graph showing the relationship between the diameter of the concave portion and the light distribution angle.

FIG. 8 is a graph showing the relationship between the diameter Lr of the concave portion 32 and the light distribution angle θf, and summarizing the results of Comparative Examples 1 to 4 and Examples 1 to 11.

As shown by this graph, the diameter Lr of the concave portion 32 (the size ratio (Lr/Dt) of the diameter Lr to the size of the optical element 14) greatly influences the light distribution angle θf. In order to reduce the light distribution angle θf, the diameter Lr of 0.55 to 1.6 [mm] (the size ratio (Lr/Dt) of 0.5 to 1.5) is preferable, and the diameter Lr of 0.6 to 1.0 [mm] (the size ratio (Lr/Dt) of 0.5 to 0.9) is more preferable.

Figure 9:
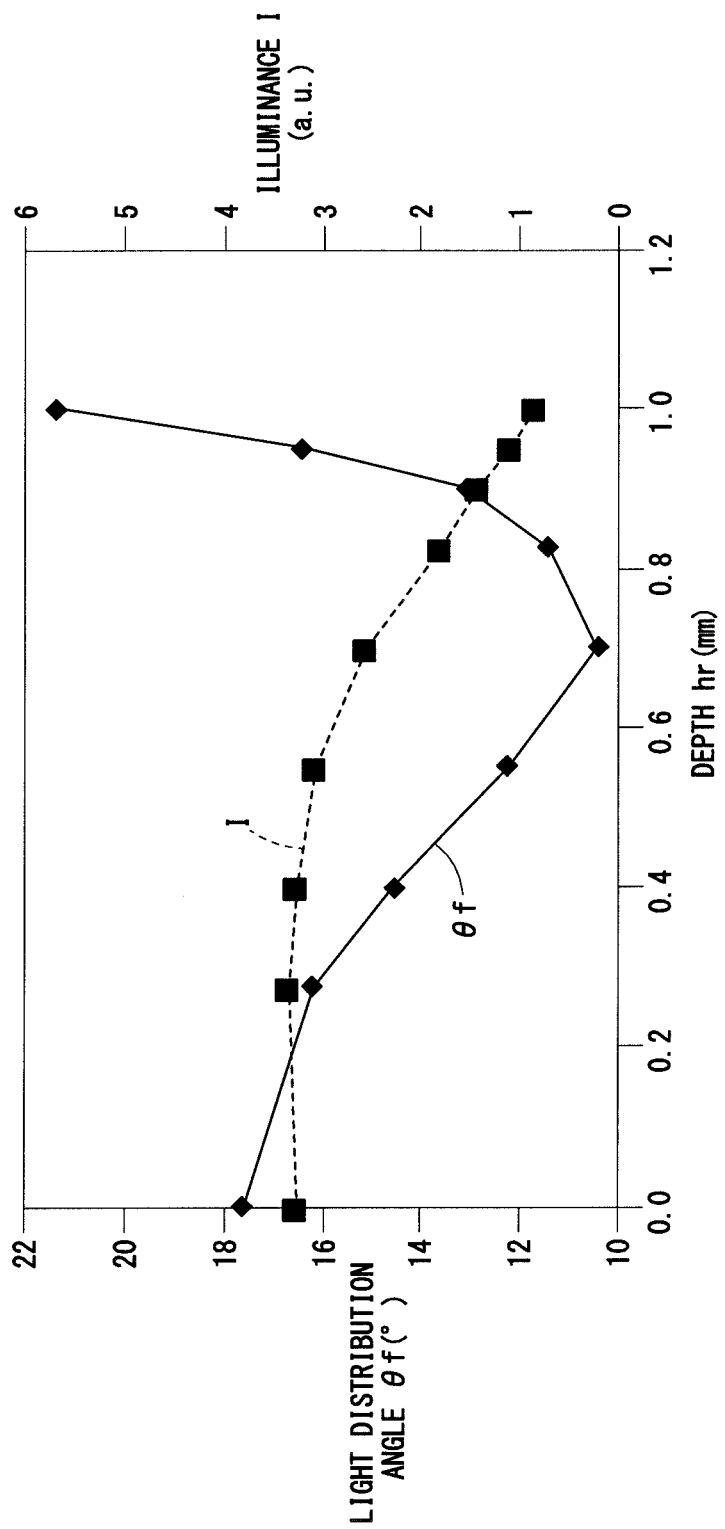
FIG. 9 is a graph showing the relationship between the depth of the concave portion and the light distribution angle (and illuminance).

FIG. 9 is a graph showing the relationship between the depth hr of the concave portion 32 and the light distribution angle θf (and illuminance I), and summarizing the results of Comparative Examples 1 and 5, and Examples 6, and 12 to 17.

As shown by this graph, the depth hr of the concave portion 32 (the aspect ratio Rr (=hr/Lr)) greatly influences the light distribution angle θf and the illuminance I. The depth hr of 0.275 to 0.95 [mm] (the aspect ratio Rr of 0.25 to 0.86) is preferable, and the depth hr of 0.275 to 0.7 [mm] (the aspect ratio Rr of 0.25 to 0.64) is more preferable. When the depth hr is out of the former range, the light distribution angle θf increases. When the depth hr is in the latter range, the ratio (I/Of) of the illuminance to the light distribution angle can be increased. (That is, in this range, the light distribution angle θf is small and the illuminance I is large).

As can be seen from a comparison between Comparative Example 1 and Examples 1, 6, and 18, the shape of the concave portion 32 is not limited to a hemispherical dome. The light distribution angle θf and the light extraction efficiency E were both better in the case where the concave portion 32 had a columnar shape than in the case where the concave portion 32 was not provided (Comparative Example 1). That is, the concave portion 32 may have any of the hemispherical dome shape, the low dome shape, the tall dome shape, and the columnar shape. In addition, it can be presumed that the light distribution angle θf and the light extraction efficiency E are better in the case where the concave portion 32 has any of the prismatic shape, the conical shape, and the pyramidal shape than in the case where the concave portion 32 is not provided (Comparative Example 1).

As shown by these results, the light converging member 10 is useful for reducing the light distribution angle θf and increasing the illuminance I.

Invention Obtained from Present Embodiment

The invention that can be grasped from the above embodiment will be described below.

[1] A light converging member (10) according to the present embodiment is used in an optical component (100) including an optical element (14) configured to emit light, and comprises: a concave portion (32) facing the optical element (14) and having a size of 0.5 times or more a maximum length of a light emitting region in the optical element (14); and a lens body (30) configured to converge light that has passed through the concave portion (32). As a result, both reduction in the light distribution angle (θf) and miniaturization of the light source can be achieved, and for example, the light distribution angle (θf) of 17° or less can be obtained.

[2] In the present embodiment, the concave portion (32) preferably has a size of 1.5 times or less the maximum length of the light emitting region in the optical element (14), and more preferably has a size of 0.9 times or less the maximum length of the light emitting region in the optical element (14). As a result, the light distribution angle (θf) can be further reduced.

[3] In the present embodiment, a ratio (aspect ratio Rr) of a depth (hr) to a diameter (Lr) of the concave portion (32) is 0.25 to 0.86. If the aspect ratio Rr is out of this range, the light distribution angle (θf) may increase.

[4] In the present embodiment, a ratio (aspect ratio Rr) of a depth (hr) to a diameter (Lr) of the concave portion (32) is 0.25 to 0.64. As a result, the ratio (I/Of) of the illuminance (I) to the light distribution angle (θf) can be increased (convergence of strong light (illuminance I) at a narrow light distribution angle θf can be achieved). When the aspect ratio (Rr) is smaller than 0.25, the light distribution angle (θf) may increase, and when the aspect ratio (Rr) is larger than 0.64, the illuminance (I) may decrease.

[5] In the present embodiment, the concave portion (32) has any of a dome shape, a columnar shape, a prismatic shape, a conical shape, and a pyramidal shape. With the concave portion (32) having any of these shapes, the light distribution angle θf can be reduced. Preferably, the concave portion (32) has a dome shape among these shapes.

[6] In the present embodiment, the light converging member (10) comprises a base (28) having an annular shape, fixed onto the mounting substrate (18), and formed integrally with the lens body (30). This facilitates fixing to the mounting substrate (18).

[7] In the present embodiment, the light converging member (10) comprises an accommodation space (26) in which the optical element (14) is accommodated, and the concave portion (32) is formed in a bottom surface of the accommodation space (26). As a result, an inexpensive flat substrate can be used as the mounting substrate (18).

[8] An optical component (100) according to the present embodiment comprises: at least one optical element (14) configured to emit light; and a light converging member (10) that includes a concave portion (32) facing the optical element (14) and having a size of 0.5 times or more a maximum length of a light emitting region in the optical element (14), and a lens body (30) configured to converge light that has passed through the concave portion (32). As a result, the light distribution angle θf can be reduced.

The light converging member and the optical component according to the present invention are not limited to the above-described embodiments, and various configurations can be adopted therein without departing from the spirit and gist of the present invention.

The invention claimed is:

1. A light converging member used in an optical component including an optical element configured to emit light, the light converging member comprising:
 a concave portion facing the optical element and having a size of 0.5 times or more a maximum length of a light emitting region in the optical element; and
 a lens body configured to converge light that has passed through the concave portion,
 wherein a ratio of a maximum height of the lens body to a maximum diameter of the lens body is greater than 0.5.

2. The light converging member according to claim 1, wherein the concave portion has a size of 1.5 times or less the maximum length of the light emitting region in the optical element.

3. The light converging member according to claim 2, wherein the concave portion has a size of 0.9 times or less the maximum length of the light emitting region in the optical element.

4. The light converging member according to claim 1, wherein a ratio (aspect ratio) of a depth to a diameter of the concave portion is 0.25 to 0.86.

5. The light converging member according to claim 1, wherein a ratio (aspect ratio) of a depth to a diameter of the concave portion is 0.25 to 0.64.

6. The light converging member according to claim 1, wherein the concave portion has any of a dome shape, a columnar shape, a prismatic shape, a conical shape, and a pyramidal shape.

7. The light converging member according to claim 6, wherein the concave portion has the dome shape.

8. The light converging member according to claim 1, wherein the light converging member comprises an accommodation space in which the optical element is accommodated, and
 the concave portion is formed in a bottom surface of the accommodation space.

9. An optical component comprising:
 at least one optical element configured to emit light; and
 a light converging member that includes
  a concave portion facing the optical element and having a size of 0.5 times or more a maximum length of a light emitting region in the optical element, and
  a lens body configured to converge light that has passed through the concave portion,
 wherein a ratio of a maximum height of the lens body to a maximum diameter of the lens body is greater than 0.5.

* * * * *